United States Patent [19]

Keeley et al.

[11] Patent Number: 4,464,717
[45] Date of Patent: Aug. 7, 1984

[54] MULTILEVEL CACHE SYSTEM WITH GRACEFUL DEGRADATION CAPABILITY

[75] Inventors: James W. Keeley, Hudson, N.H.; Edwin P. Fisher, North Abington; John L. Curley, North Andover, both of Mass.

[73] Assignee: Honeywell Information Systems Inc., Waltham, Mass.

[21] Appl. No.: 364,052

[22] Filed: Mar. 31, 1982

[51] Int. Cl.³ .............................................. G06F 13/00
[52] U.S. Cl. .................................................. 364/200
[58] Field of Search .................. 364/200, 900; 371/11, 371/14, 21

[56] References Cited

U.S. PATENT DOCUMENTS

| T932,005 | 3/1975 | Kruskal | 371/21 |
|---|---|---|---|
| 3,685,020 | 8/1972 | Meade | 364/200 |
| 3,820,078 | 6/1974 | Curley et al. | 364/200 |
| 3,848,234 | 11/1974 | MacDonald | 364/200 |
| 4,020,466 | 4/1977 | Cordi et al. | 364/200 |
| 4,051,460 | 9/1977 | Yamada et al. | 371/11 |
| 4,053,752 | 10/1977 | DeJohn et al. | 371/11 |
| 4,144,566 | 3/1979 | Timsit | 364/200 |
| 4,195,342 | 3/1980 | Joyce et al. | 364/200 |
| 4,195,343 | 3/1980 | Joyce | 364/200 |
| 4,342,084 | 7/1982 | Sager et al. | 371/21 |

OTHER PUBLICATIONS

IBM Technical Disclosure Bulletin, M. W. Bee et al., vol. 13, No. 2, Jul. 1970, "Removal of Failing Buffer Sections in a Buffer Backing Store".
IBM Technical Disclosure, Sep. 1978, vol. 21, No. 6, F. J. Sparacio, Data Processing System with Second Level Cache.

Primary Examiner—Jerry Smith
Assistant Examiner—Jameson Lee
Attorney, Agent, or Firm—Faith F. Driscoll; Nicholas Prasinos

[57] ABSTRACT

The directory and cache store of a multilevel set associative cache system are organized in levels of memory locations. Round robin replacement apparatus is used to identify in which one of the multilevels information is to be replaced. The directory includes parity detection apparatus for detecting errors in the addresses being written in the directory during a cache memory cycle of operation. Control apparatus combines such parity errors with signals indicative of directory hits to produce invalid hit detection signals. The control apparatus in response to the occurrence of a first invalid hit detection signal conditions the round robin apparatus as well as other portions of the cache system to limit cache operation to those sections whose levels are error free thereby gracefully degrading cache operation.

36 Claims, 7 Drawing Figures

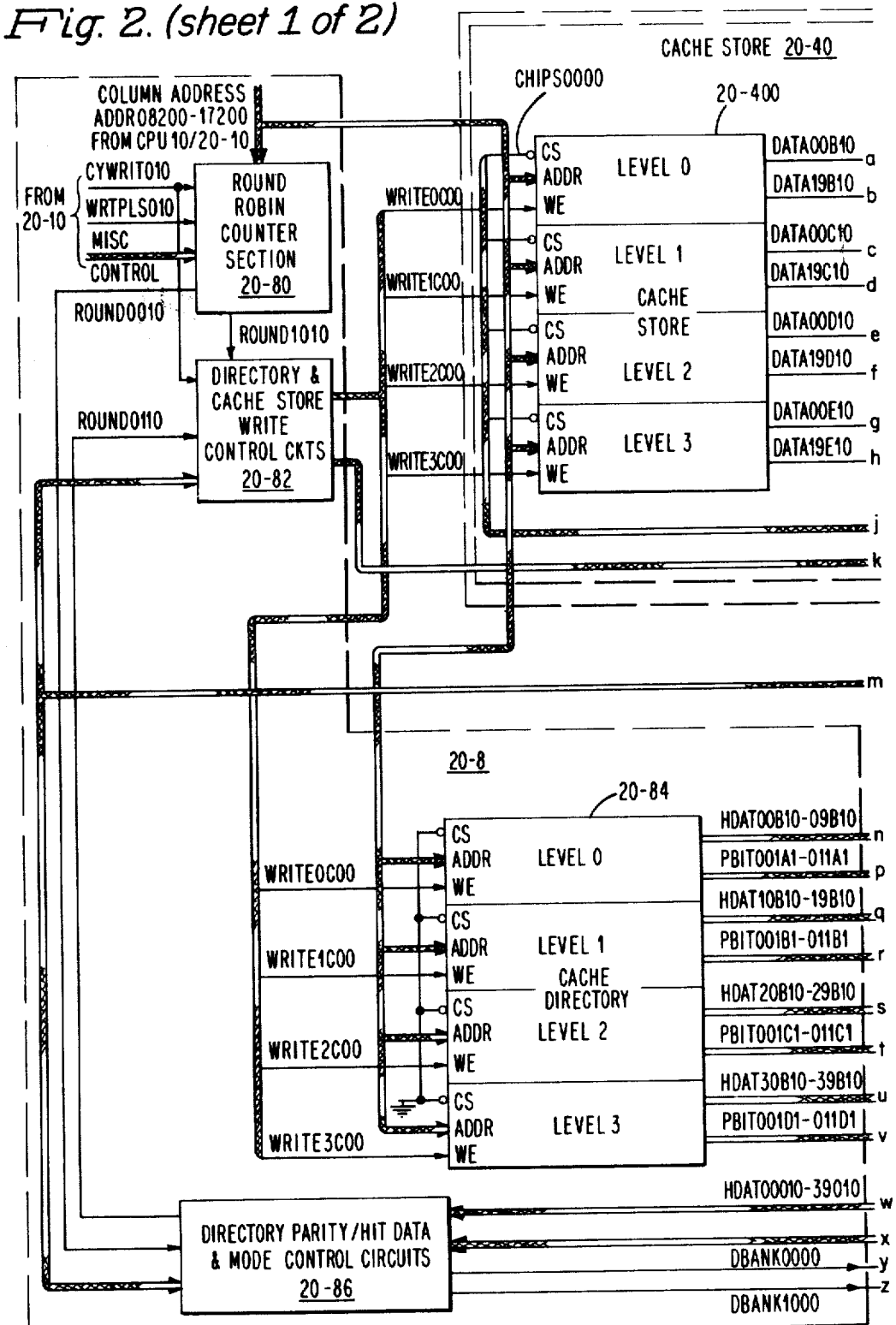
Fig. 2. (sheet 1 of 2)

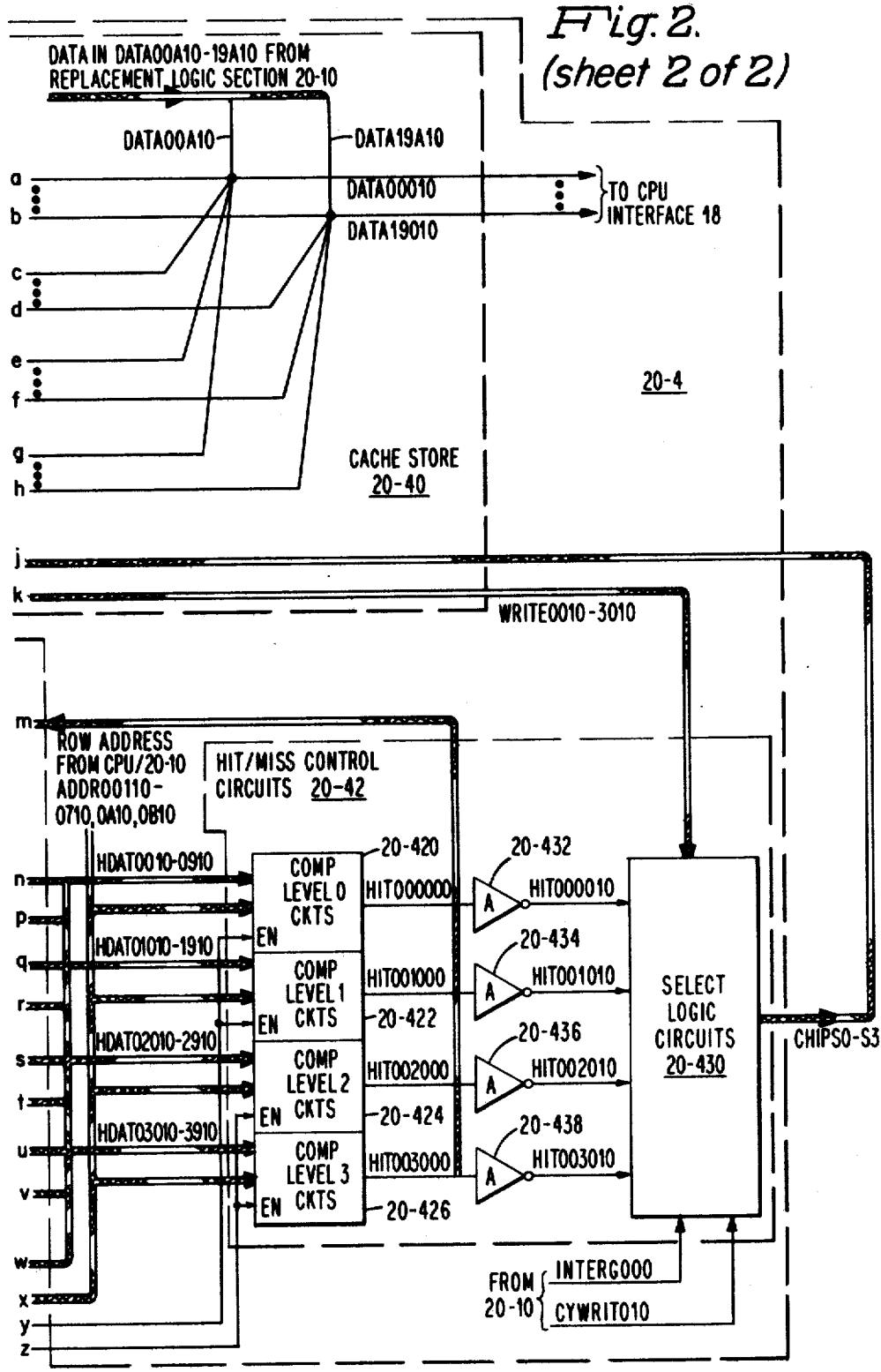

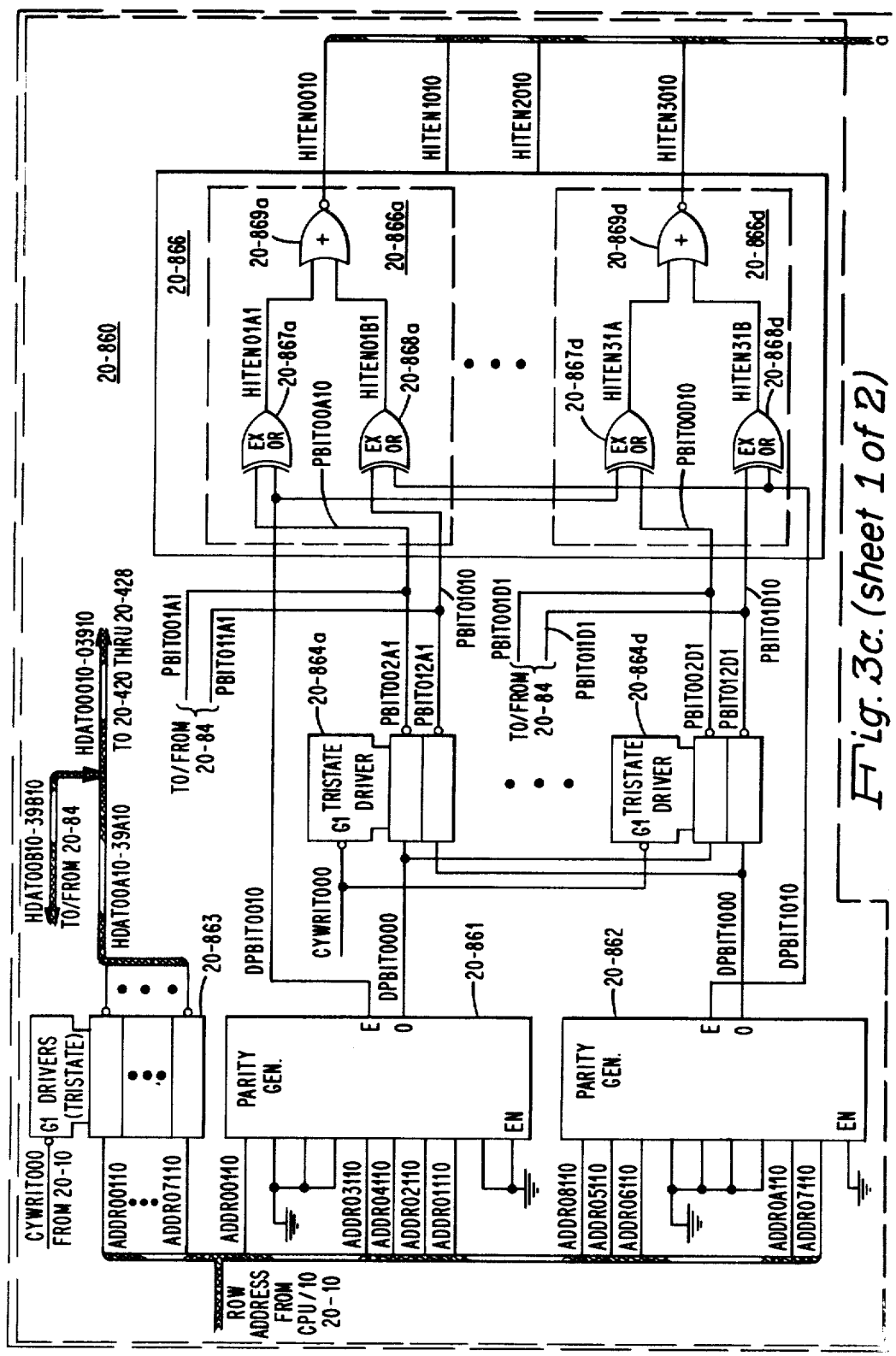
Fig. 3c. (sheet 1 of 2)

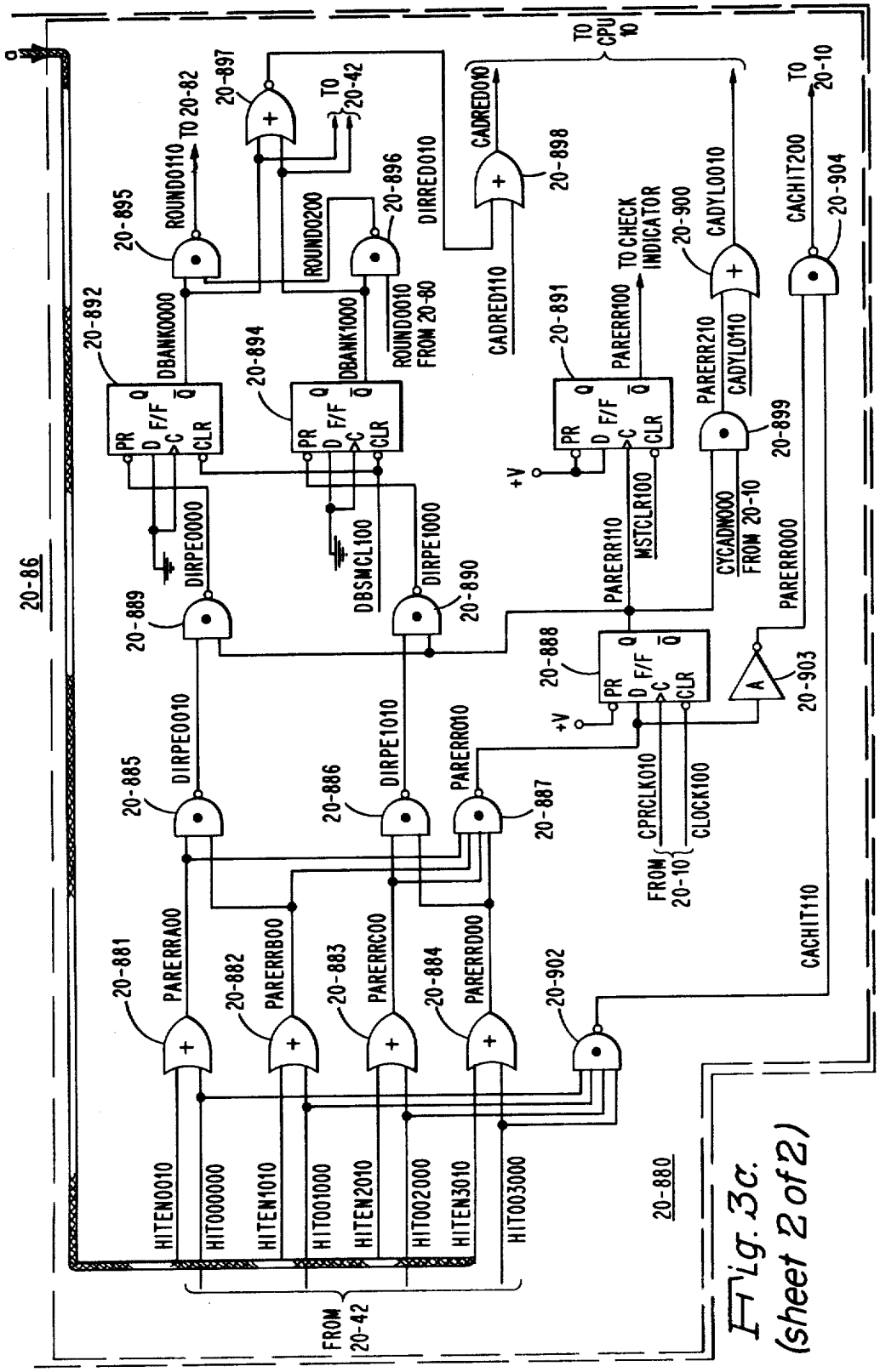
Fig. 3c. (sheet 2 of 2)

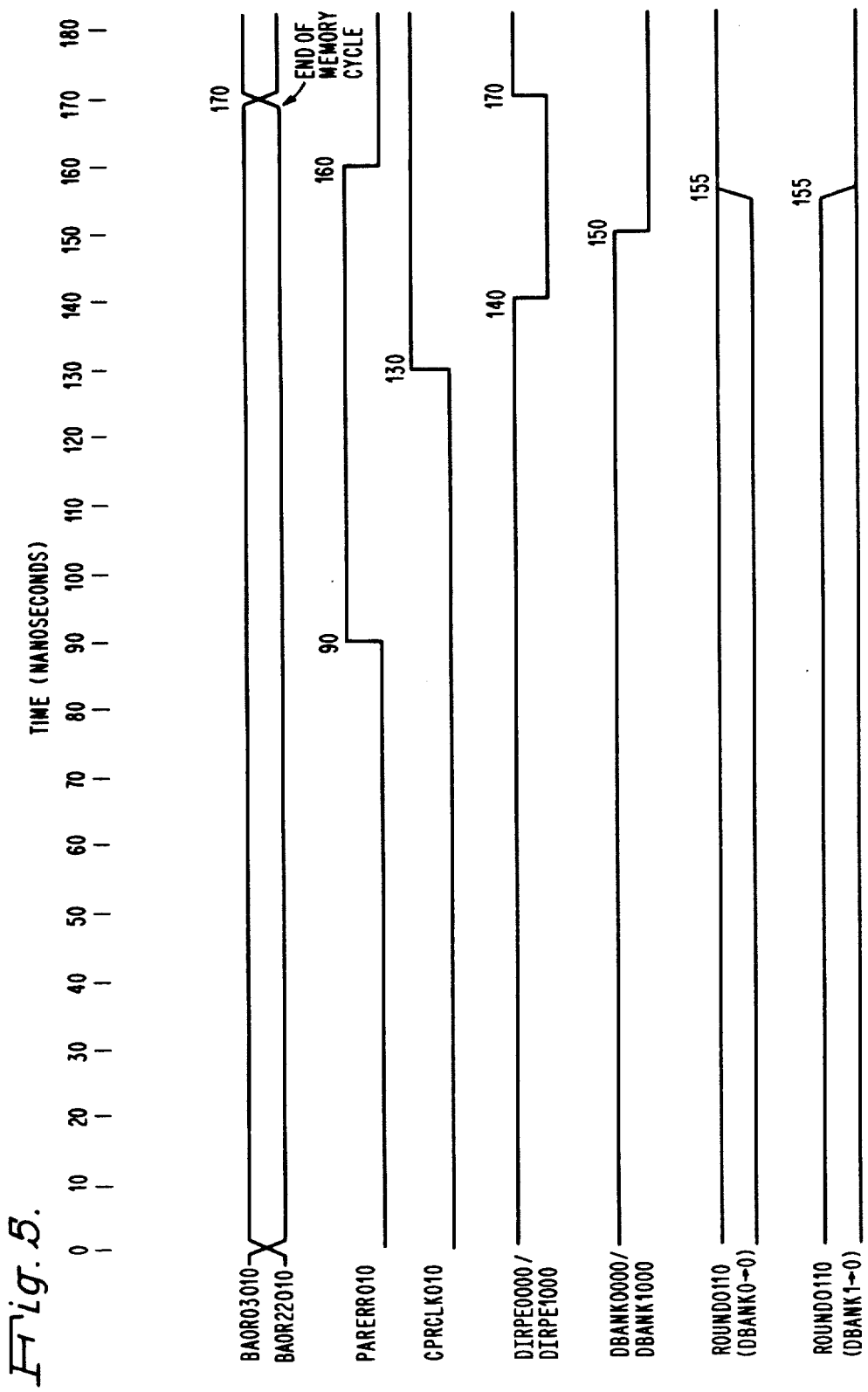

MULTILEVEL CACHE SYSTEM WITH GRACEFUL DEGRADATION CAPABILITY

BACKGROUND OF THE INVENTION

1. Field of Use

The present invention relates to cache systems and, in particular, to cache systems includable within minicomputer and microprocessing systems.

2. Prior Art

It is well known in the art to provide cache systems within computer systems to improve overall system performance and provide for reliable operation. Examples of such systems are disclosed in U.S. Pat. No. 3,820,078 to John L. Curley, et al. and in IBM Technical Disclosure Bulletin titled "Removal of Failing Buffer Sections in a Buffer Backing Store" by M. W. Bee, et al., Vol. 13, No. 2, dated July 1970. In those systems, reliable operation is achieved by invalidating cache memory locations detected as having bad parity. This requires additional bits to be associated with the cache locations and can add considerably to the cost and complexity of the cache system. More importantly, it requires processing time for carrying out such invalidating operations.

Other prior art cache systems permit the cache to be bypassed upon the detection of fault conditions by the central processing unit (CPU) associated therewith. An example of this type of system is disclosed in U.S. Pat. No. 4,195,343 to Thomas F. Joyce which is assigned to the same assignee as named herein. In general, this type of cache system is designed to report two types of errors to the CPU, a memory "red" error condition indicative of an uncorrectable error and a memory "yellow" condition indicative of a correctable error. Upon the receipt of a "red" error signal or the detection of a byte data parity error in received memory data, the CPU switches the entire cache off-line, reports the error to the operating system and continues processing.

While the above systems allow disconnection of a cache unit as a consequence of a fault condition, it requires the CPU to process such fault conditions. This can prove time consuming and could also result in loss of valuable information since such diagnosis relies in part upon the types of error conditions reported by the cache system itself.

Accordingly, it is a primary object of the present invention to provide a reliable cache system which is low in cost and has minimal complexity.

It is still a further object of the present invention to provide a cache system which has improved maintainability thereby increasing system reliability.

SUMMARY OF THE INVENTION

The above objects and advantages are achieved in a preferred embodiment of the multilevel set associative cache system of the present invention which is positioned between a central processing unit (CPU) and a main store. According to the invention, the directory and cache stores are organized into a number of levels of memory locations.

The directory store includes error detection apparatus for detecting errors in the directory store addresses during cache read and write memory cycles of operation. The error detection apparatus couples to control apparatus which combines the error signals with signals indicative of cache hits to produce invalid hit detection signals. The presence of soft or hard errors within the directory store indicated by invalid hit signals if gone undetected would result in the cache system delivering false or incorrect data.

In the preferred embodiment, the control apparatus couples to round robin replacement apparatus which is used to identify the cache level in which information is to be replaced. In accordance with the teachings of the present invention, the control apparatus, in response to the occurrence of a first invalid hit detection signal, places the cache system in a degraded mode. When in this mode, the replacement apparatus as well as other portions of the cache system are conditioned to limit cache read and write memory operations to a subdivision of the number of cache levels which are error free thereby gracefully degrading cache operation. In order to preserve the integrity of memory information, the control apparatus, in response to the occurrence of subsequent invalid hit detections signals, generates signals which effectively places the cache system off-line.

The above arrangement improves system reliability and performance. By including apparatus within the cache which can disable subdivisions of the cache system associated with directory errors, the processing time normally required to verify reported failures and carry out disabling operations is eliminated. Since the cache system is still operational, CPU performance is not substantially reduced as in those system which bypass the entire cache system in response to a memory failure.

Additional increases in performance and speed result from disabling cache subdivisions only in response to error conditions detected during cache hits which reduces the number of necessary checks to a minimum. That is, checking is limited to situations which will result in the delivery of false data.

The novel features which are believed to characteristic of the invention, both as to its organization and method of operation, together with further objects and advantages will be better understood from the following description when considered in connection with the accompanying drawings. It is to be expressly understood, however that each of the drawings are given for the purpose of illustration and description only and are not intended as a definition of the limits of the present invention.

BRIEF DESCRIPTION OF THE DRAWINGS

FIG. 2 is a block diagram of the cache unit of FIG. 1.

FIGS. 3a through 3c show in greater detail different portions of the cache unit of FIG. 2.

FIG. 5 is a timing diagram used to explain the operation of the present invention.

DESCRIPTION OF THE PREFERRED EMBODIMENT

Figure 1:
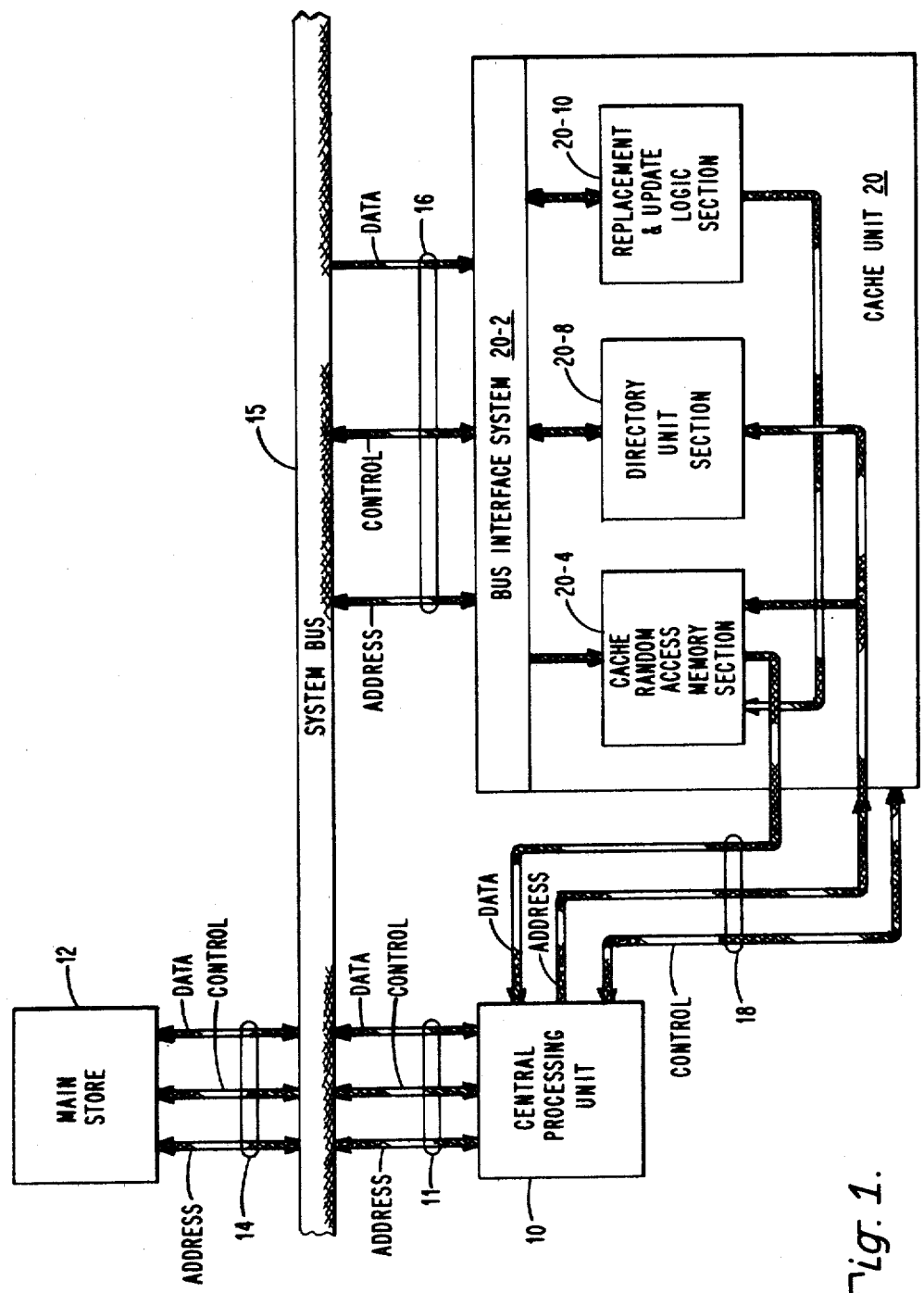
FIG. 1 is a block diagram of a minicomputer system which includes the cache unit of the present invention.

Referring to FIG. 1, it is seen that the minicomputer system includes a central processing unit (CPU) 10, a main store 12 and a cache unit 20. As shown, the CPU 10, main store 12 and cache unit 20 couple to a system bus 15 via address control and data lines of bus interfaces 11, 14 and 16, respectively. Additionally, CPU 10 and cache unit 20 are interconnected through the address, control and data lines of a private interface 18.

For the purposes of the present invention, CPU 10 and main store 12 may be considered conventional in design. Main store 12 is a MOS memory which can include up to 1,048,576 words organized in 1,024 rows by 1,024 columns. For example, CPU 10 and main store 12 may take the form of the CPU and main memory described in U.S. Pat. No. 4,195,343 issued Mar. 25, 1980, assigned to the assignee named herein. Also, they may take the form of the units included in the Series 60 Level 6 Model 40 minicomputer manufactured by Honeywell Information Systems Inc.

The cache unit 20 provides high speed access to processor data and instructions which have been previously used or are expected to be used (e.g. prefetched). In general, CPU 10 requests data words and instructions via private interface 18. When the requested word is in cache, the cache unit 20 transfers the requested word over the interface 18. When the requested word is not stored in cache, cache unit 20 fetches the word from main store 12 and transfers it to CPU 10 via private interface 18.

The cache unit 20 of the preferred embodiment includes a bus interface section 20-2, a directory section 20-8, a cache random access memory (RAM) section 20-4 and a replacement logic section 20-10. The bus interface section 20-2 includes the bus control circuits for enabling the cache unit 20 to access main store 12 through asynchronous system bus 15 for fetching data and instructions in response to requests from CPU 10. For further information regarding these circuits and the operation of system bus 15, reference may be made to U.S. Pat. Nos. 3,993,981, 4,030,075 and 4,195,343.

The directory section 20-8 determines whether or not the CPU requested word resides in Section 20-4. To accomplish this, the directory section 20-8 as discussed herein includes a 4-level set associative memory. Also, it operates to generate invalid hit detection signals in response to error signals used for placing the cache unit 20 in a degraded mode of operation in accordance with the teachings of the present invention.

The cache RAM section 20-4 includes the high speed storage for CPU data and instructions. It has 4096 words of storage which are organized into four by 1,024 columns of storage. Accordingly, each column of main store 12 has four entries in cache section 20-4 associated therewith.

The replacement logic section 20-10 includes the circuits which control access to main store 12 for fetching data or instructions requested by CPU 10 which were not found in cache RAM section 20-4. Also, it includes logic circuits for storing information received from main store 12 in both the cache RAM section 20-4 and directory section 20-8 during replacement and update operations.

Cache RAM Section 20-4

FIG. 2 illustrates in block diagram form, the units which comprise sections 20-4 and 20-8. As seen from the Figure, section 20-4 includes the 4-level cache store 20-40 and hit/miss control circuits 20-42. Each level of store 20-40 includes six RAM chips, each chip containing 1024 by 4-bit locations. As seen from FIG. 2, each RAM chip receives column address signals ADDR08200 through ADDR17200 from replacement logic section 20-10. These signals correspond to the least significant 10 address bits of the main store address received from CPU 10 (e.g. bits 10-19). Additionally, the six chips of each level receive a corresponding one of the chip select signals CHIPS0000 through CHIPS3000 from the circuits of block 20-42. When any one of these signals is forced to a binary ZERO, all of the RAM chips of the designated level are enabled for operation.

The RAM levels may be considered conventional in design and may, for example, by constructed from 2149H MOS memory chips manufactured by Intel Corporation.

Lastly, the RAM chips of each level receive a corresponding one of the write enable signals WRITE0C00 through WRITE3C00 from directory section 20-8. When any one of these signals is forced to a binary ZERO, all of the chips of the designated level are enabled for a write operation. The data to be written into the designated level is applied to a set of data in lines as signals DATA00A10 through DATA19A10 which are received from section 20-10. Also, data is read out from the chips of each level to a set of output lines as signals DATA00010 through DATA19010. The input and output data lines common to each level are connected in a wired OR arrangement as shown in FIG. 2.

As seen from FIG. 2, the hit/miss control circuits of block 20-42 include four comparator circuits 20-420 through 20-426. These circuits compare the row address signals ADDR0010 through ADDR0710, signals ADDR00A10 and ADDR00B10 from CPU 10 or replacement logic section 20-10 with the address signals read out from a corresponding one of the directory levels (i.e., signals HDAT00B10-09B10, HDAT10B10-19B10, HDAT20B10-29B10 and HDAT30B10-39B10). The row address corresponds to the most significant 10 bits of the main store address (i.e., bits 0–9).

Each of the comparator circuits 20-420 through 20-426 generates a corresponding one of the hit signals HIT000000 through HIT003000 indicative of the results of the comparison. The hit signals are applied as inputs to directory section 20-8 and to the select logic circuits of block 20-430. When there is a true or identical comparison, the comparator circuit forces a corresponding one of the hit signals to a binary ZERO.

The comparator circuits are conventional in design. For example, each comparator circuit may be constructed from 10 exclusive OR circuits connected to compare each pair of corresponding address bits and a NAND gate connected to receive the outputs of the exclusive OR circuits. Additionally, the NAND gate is connected to receive one of the pairs of signals DBANK0000 and DBANK1000 from directory section 20-8. As explained herein, the states of these signals establish whether or not cache unit 20 is being operated in a degraded mode of operation.

As seen from FIG. 2, signals HIT000000 through HIT003000 are inverted by inverter circuits 20-432 through 20-438 and the output signals HIT000010 through HIT003010 are applied as inputs to the logic circuits of block 20-430. These circuits operate to generate chip enable signals CHIPS0000 through CHIPS3000. These signals are generated in accordance with the following Boolean equations wherein the symbol + represents an OR operation and the symbol · represents an AND operation.

CHIPS0000 =

$$\overline{\text{HIT000010} \cdot \text{INTERG000} + \text{WRITE0010} \cdot \text{CYWRIT010}}$$

CHIPS1000 =

-continued $$\text{CHIPS2000} = \overline{\text{HIT001010} \cdot \text{INTERG000} + \text{WRITE1010} \cdot \text{CYWRIT010}}$$

$$\text{CHIPS3000} = \overline{\text{HIT002010} \cdot \text{INTERG000} + \text{WRITE2010} \cdot \text{CYWRIT010}}$$

$$\overline{\text{HIT003010} \cdot \text{INTERG000} + \text{WRITE3010} \cdot \text{CYWRIT010}}.$$

The signals INTERG000 and CYWRIT010 are timing signals generated by the circuits of replacement logic section 20-10.

Signal INTERG000 is a binary ZERO when data is not being applied to bus interface 18 from cache store 20-40. Signal CYWRIT010 is forced to a binary ONE during each memory write cycle of operation. For further information regarding the operation of these signals, reference may be made to U.S. Pat. No. 4,195,343.

Directory Section 20-8

As seen from FIG. 2, section 20-8 includes the round robin counter circuits of block 20-80, the directory and cache store write control circuits of block 20-82, the four-level set associative directory 20-84 and the directory parity and mode control circuits of block 20-86. The round robin counter circuits of block 20-80 select the next column of cache store 20-400 whose information is to be replaced with new information. The round robin replacement technique employed replaces the least recently replaced location with new information. Briefly, each cache column is managed independently in that the circuits of block 20-80 ascertain which of the four entries of the column is to be allocated a word from a corresponding main memory column. The allocation is carried out by employing a separate counter for each column whose contents point to the next word location in the cache column to be assigned or allocated. As each new word is stored in cache, the counter associated with the cache column is incremented by one in a wraparound fashion so that the fifth in a series of new memory references to the same column replaces the information of first memory reference. Thus, the contents of a cache word location that is the least recently replaced in a column is replaced by information from a memory reference to a word in the corresponding memory column that is not already in cache.

Round Robin Counter Circuits 20-80

Figure 3A:
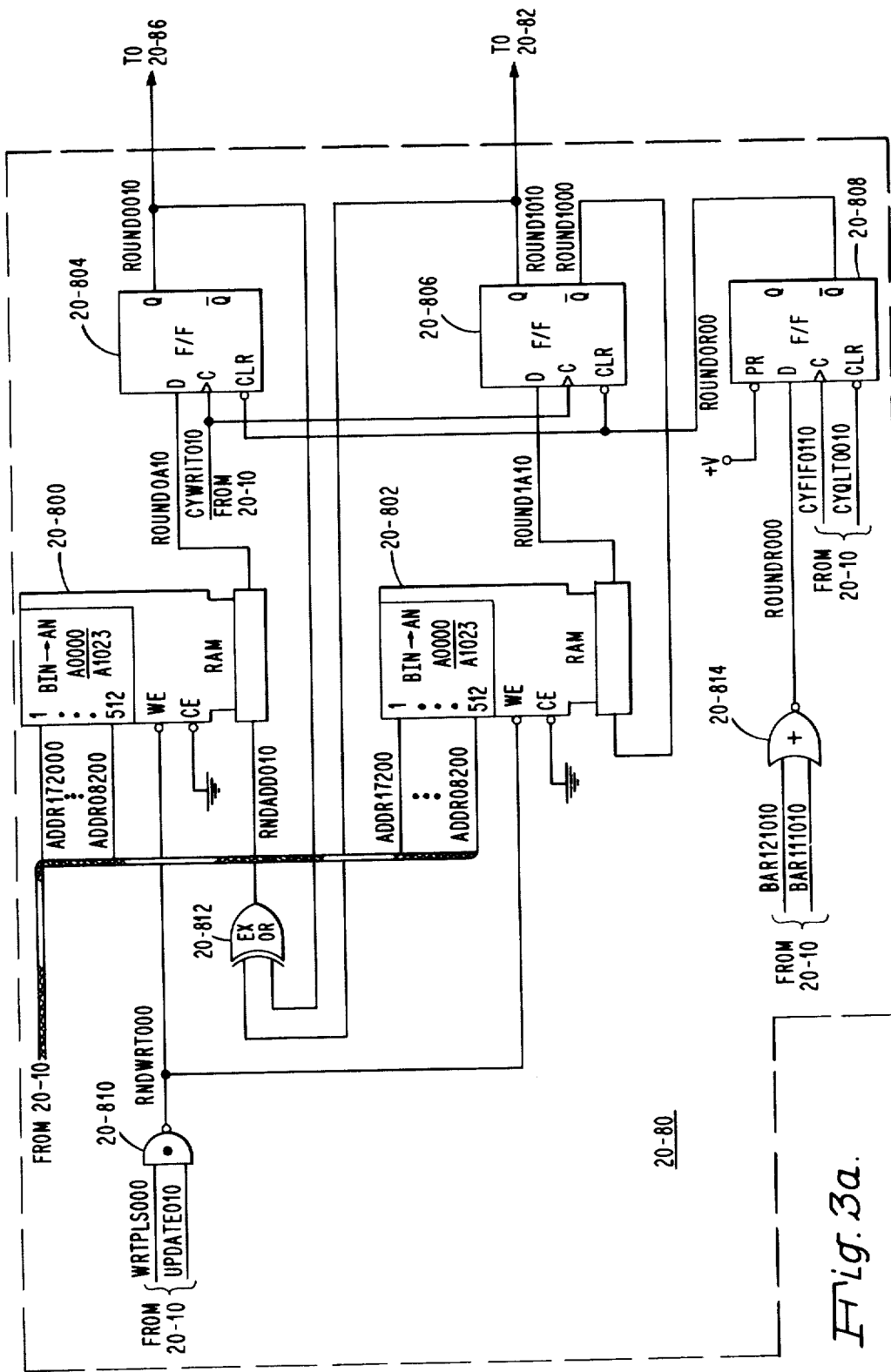

As seen in FIG. 3a, the round robin counter circuits of block 20-80 include a pair of 1-bit X 1024 RAM chips 20-800 and 20-802, a plurality of D-type flip-flops 20-804 through 20-808, a NAND gate 20-810, an exclusive OR gate 20-812 and a NOR gate 20-814 connected as shown. The chip enable terminals (CE) of RAM chips 20-800 and 20-802 connect to ground which enable the chips for a read or write cycle of operation. The RAM chips 20-800 and 20-802 in response to column address signals ADDR08200 through ADDR17200 applied to the chips' address input terminals by section 20-10 generate output signals ROUND-0A10 and ROUND1A10 which specify the cache column storing the least recently replaced information.

The write enable terminals (WE) of RAM chips 20-800 and 20-802 are enabled for a write cycle of operation as a function of signal RNDWRT000 from NAND gate 20-810. When write signal WRTPLS000 generated from delaying signal CYWRIT010 and signal UPDATE010 are both binary ONES, NAND gate 20-810 forces signal RNDWRT000 to a binary ZERO enabling RAM chips 20-800 and 20-802 for a write cycle of operation.

Write cycles of operation are generated during a quality logic test (QLT) mode of operation wherein the first 4096 data words stored in main store 12 are written into cache. During the QLT mode, signal CYQLT0010 is a binary ONE enabling flip-flop 20-808 to switch state as a function of signal ROUNDR000.

When both signals BAR012010 and BAR111010 are binary ZEROS, NOR gate 20-814 forces signal ROUNDR000 to a binary ONE. When cycle timing signal CYF1F01100 switched to a binary ONE, signal ROUNDR000 switches flip-flop 20-808 to a binary ONE. This in turn forces the binary ZERO output signal ROUND0R00 to a bianary ZERO.

Signal ROUND0R00 when a binary ZERO generates a clear signal which holds flip-flops 20-804 and 20-806 in their binary ZERO states. The binary ZERO states of signals ROUND0010 and ROUND1010 cause exclusive OR gate 20-812 to force signal RNDADD010 to binary ZERO. Accordingly, a binary ZERO is applied to the data input terminal of RAM chip 20-800. At the same time, since flip-flop 20-806 is in a binary ZERO state, signal ROUND1000 is a binary ONE. Therefore, a binary ONE is applied to the data input terminal of RAM chip 20-802.

During a first addressing sequence, signal CYWRIT010 is forced to a binary ONE during each of the 1024 write cycles which in turn forces write pulse enable signal WRTPLS000 to a binary ONE. Since signal UPDATE010 is a binary ONE during QLT mode, NAND gate 20-810 forces signal RNDWRT000 to a binary ZERO enabling both RAM chips 20-800 and 20-802 for a write cycle of operation. During the write cycle, a binary ZERO is written into a bit location of RAM chip 20-800 while a binary ONE is written into a bit location of RAM chip 20-802.

Binary ZEROS are successively written into the 1024 bit locations of RAM chip 20-800 corresponding to addresses 0000-1023 while binary ONES are successively written into the 1024 bit locations of RAM chip 20-802 having the same corresponding addresses. During the first addressing sequence, the binary ZERO outputs from flip-flops 20-804 and 20-806 are applied to other portions of the cache, enabling the cache and directory locations of level 0 to be written.

When the address 1024 (2000)$_8$ is reached signalling the end of the first sequence, signal BAR12010 is forced to a binary ONE. This causes NOR gate 20-814 to force signal ROUNDR000 to a binary ZERO. When cycle timing signal CYFIF0110 switches to a binary ONE, flip-flop 20-808 switches to a binary ZERO. At this time, flip-flops 20-804 and 20-806 are enabled for switching. Again, address 0000$_8$ is applied to RAM chips 20-800 and 20-802. Signal ROUND0A10 read from RAM chip 20-800 is a binary ZERO while signal ROUND1A10 read from RAM chip 20-802 is a binary ONE. When signal CYWRIT010 switches to a binary ONE, flip-flop 20-806 switches to a binary ONE state. This causes exclusive OR circuit 20-812 to switched signal RNDADD010 to a binary ONE. Accordingly, a binary ONE signal is applied to the data input of RAM chip 20-800 while a binary ZERO signal is applied to the data input of RAM chip 20-802. Accordingly, a binary ONE is written into the first bit location of RAM chip 20-800 while a binary ZERO is written into the first bit location of RAM chip 20-802. The second address sequence continues with binary ONES being written into the 1024 bit locations of RAM chip 20-800 and binary ZEROS being written into the 1024 bit locations of RAM chip 20-802. During the second addressing sequence, the binary ZERO and binary ONE outputs from flip-flops 20-804 and 20-806 enable data words and row addresses to be written into the level 1 cache and directory locations, respectively.

During the third and fourth addressing sequences, data words and row addresses are written into second and third levels of cache store 20-400 and directory 20-84. For further information regarding the QLT mode of operation, reference may be made to U.S. Pat. No. 4,195,343.

Directory and Cache Write Control Circuits 20-82

Figure 3B:
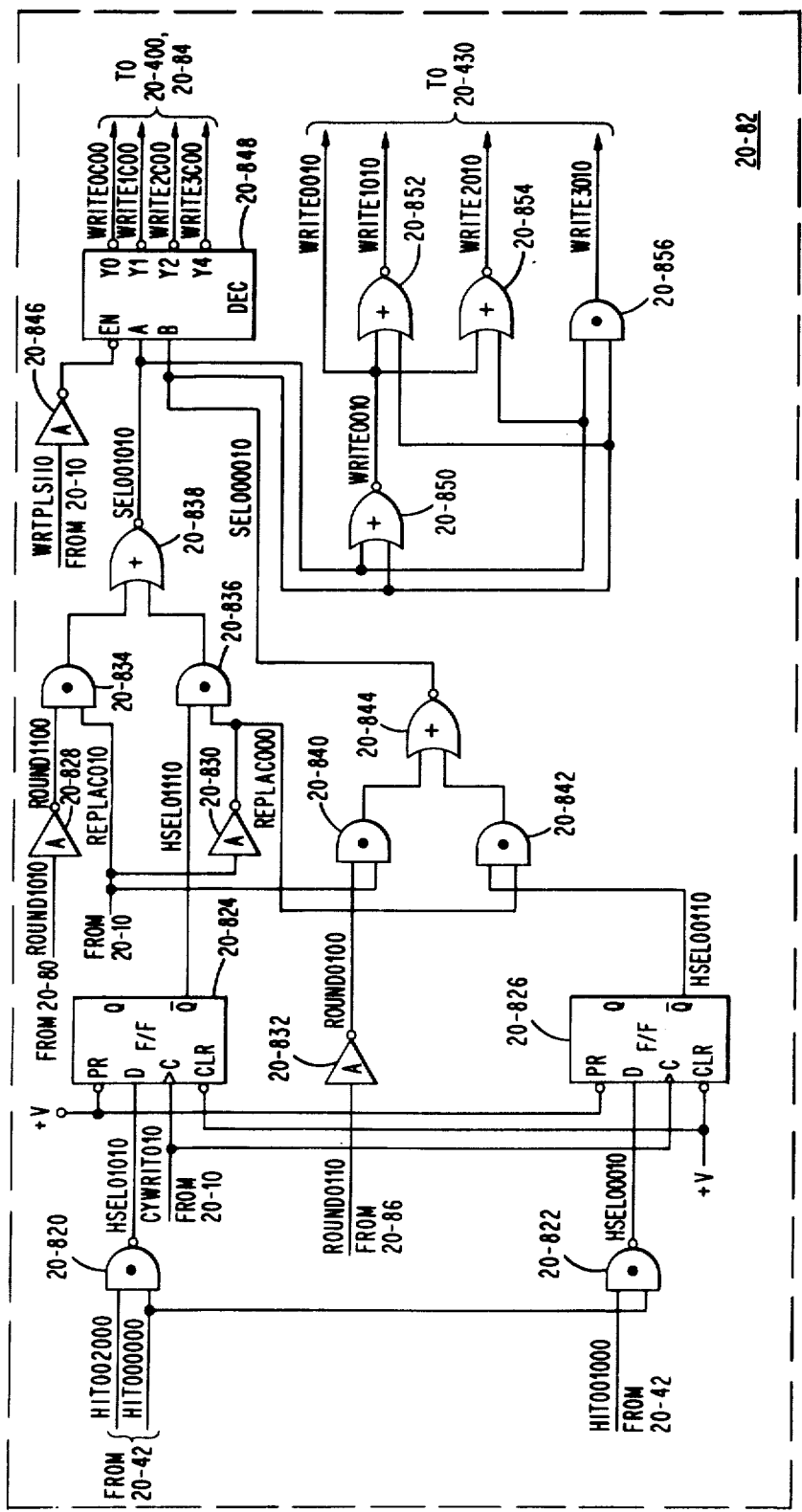

The directory and cache store write control circuits of block 20-82 are shown in greater detail in FIG. 3b. These circuits in response to cache hit signals HIT001000 through HIT002000 from Section 20-4 and round robin signals ROUND0110 and ROUND1010 from sections 20-86 and 20-80 are operative to generate sets of write signals WRITE0C00 through WRITE3C00 and WRITE0010 through WRITE3010. The signals WRITE0C00 through WRITE3C00 are applied to cache store 20-400 and cache directory 20-84 for enabling data words and row addresses respectively to be written into the sepcified cache and directory locations during both replacement and write cycles of operations.

In greater detail, the circuits of block 20-82 include a pair of NAND gates 20-820 and 20-822, a pair of D-type flip-flops 20-824 and 20-826, a plurality of inverter circuits 20-828, 20-830, 20-832 and 20-846, a plurality of AND gates 20-834, 20-836, 20-840, 20-842 and 20-856, a plurality of NOR gates 20-838, 20-844, 20-850 through 20-854 and a decoder circuit 20-848. The NAND gates 20-820 and 20-822 in response to signals HIT000000 through HIT002000 generate hit select signals HSEL01010 and HSEL00010, respectively, for setting D-type flip-flops 20-824 and 20-826. Two sets of AND/NOR gates 20-834, 20-836, 20-838 and 20-840, 20-842, 20-844 combine different ones of the round robin signals ROUND1010, ROUND0110, replacement signals REPLAC010 and REPLAC000 and hit select signals HSEL01110, HSEL00110 to generate select signals SEL001010 and SEL000010 as shown. The signals are decoded by decode circuit 20-848 and result in an appropriate one of the write signals WRITE0C00 through WRITE3C00 being forced to a binary ZERO state in response to write signal WRTPLS110. Also, signals SEL00010 and SEL001010 are selectively combined within NOR gates 20-850 through 20-854 and AND gate 20-856 for generating corresponding ones of the write signals WRITE0010 through WRITE3010.

Cache Directory 20-84

As seen from FIG. 2, each level of the 4-level cache directory includes three RAM chips, each chip containing 1024 by 4 bit locations. Each RAM chip receives column address signals ADDR08200 through 17200 from section 20-5. These signals correspond to the most significant 10 address bits of the main store request address (i.e., bits 0-9). All of the chips of the directory 20-84 are enabled by grounding the chip select terminals (CS) of the chips as indicated in FIG. 2.

Additionally, the three chips of each level receive a corresponding one of the write enable signals WRITE0C00 through WRITE3C00 from section 20-82. When any one of these signals is forced to a binary ZERO, all of the chips of the designated level are enabled for a write operation.

During normal operation, the directory address data to be written into the designated level is inverted and applied via tristate driver circuits of block 20-86 to a corresponding one of sets of data in lines as one of the sets of signals HDAT00B10-HDAT09B10 through HDAT30B10-HDAT39B10 of the designated level. Additionally, as explained herein, parity generator circuits included within block 20-86 generate signals PBIT001A1, PBIT011A1 through PBIT001D1, PBIT011D1 which are the sets of parity bits for different five bit portions of the row address which are also written into the designated directory level.

Directory Parity and Mode Control Circuits 20-86

The directory parity and mode control circuits of block 20-86 are shown in greater detail in FIG. 3c. These directory parity circuits include the parity generation circuits, address and parity driver circuits and comparator circuits of block 20-860. The mode control circuits include the hit comparator, mode control and the error indicator circuits of block 20-880.

As seen from FIG. 3c, block 20-860 includes a pair of parity generator circuits 20-861 and 20-862, each of which generates a parity bit for a different five bits of the row address portion of the input memory address from Section 20-10. The same row address is applied to the inverter tristate driver circuit of block 20-863. These circuits are enabled during a write operation by signal CYWRIT000 being forced to a binary ZERO. This causes the inverted row address to be applied at the driver output terminals as signals HDAT00A10 through HDAT39A10.

From there, they are applied to the data input/output terminals of the cache directory chips of each of the levels of directory 20-84. During each read operation, the driver circuits of block 20-863 are disabled enabling the cache directory row address read out from directory 20-84 to be applied as the four sets of signals HDAT00010-0810 through HDAT03010-3910 to comparator circuits 20-420 through 20-428. As mentioned, these signals are compared with the row address for determining the occurrence of a hit condition.

In a similar fashion, the generated odd parity signals DPBIT0000 and DPBIT1000 are applied to the inputs of inverting tristate driver circuits 20-864a through 20-864d. When enabled during a write operation, the inverted parity signals are applied to the input/output terminals of the cache directory chips of the directory levels of directory 20-84. By inverting the row address and associated parity bits therewith, it is possible to reduce the amount of logic circuits required to perform the desired comparison.

During a read operation, the driver circuits 20-864a through 20-864d are disabled and the four pairs of parity bit signals read out from directory 20-84 are applied to corresponding ones of the four comparator circuits 20-866a through 20-866d of block 20-866. The pairs of directory parity signals are compared with the parity signals DPBIT0010 and DPBIT1010 generated by circuits 20-861 and 20-862.

As seen from FIG. 3c, each of the comparator circuits 20-866a through 20-866d includes a pair of exclusive OR gates (e.g. 20-867a and 20-868a) whose outputs are combined within an output NOR gate (e.g. 20-869a). When the row address generated parity bits compare with the bits read out from the corresponding directory level, then the output NOR gate forces a corresponding one of the hit enable signals HITEN0010 through HITEN3010 to a binary ONE state. This indicates that no directory parity error was detected. When a directory parity error is detected in a level, a corresponding one of the signals HITEN0010 through HITEN3010 is forced to a binary ZERO state.

The hit enable signals are applied as inputs to the circuits of block 20-880. These circuits include four OR gates 20-881 through 20-884 which combine the hit enable signals HITEN0010 through HITEN3010 with the hit signals HIT000000 through HIT003000 from Section 20-42 to generate hit invalid signals PARERRA00 through PARERRD00. When a hit condition is detected by the circuits of Section 20-42, a corresponding one of the signals HIT000000 through HIT003000 is forced to a binary ZERO state. When a directory parity error is detected by the comparator circuits 20-866, the hit enable signal for that level is forced to a binary ZERO. This in turn causes one of the OR gates 20-881 through 20-884 to force the appropriate hit invalid signal to a binary ZERO state.

All four of the hit invalid signals are combined within a NAND gate 20-887. This gate forces signal PARERR010 to a binary ONE in response to an invalid hit (i.e., when one of the signals PARERRA00 through PARERRD00 is a binary ZERO). The signal PARERR010 is clocked into a D-type flip-flop 20-888 in response to signal CPRCLK010 from Section 20-10. The state of flip-flop 20-888 signals when the directory parity error condition is valid (i.e., occurs during a directory read cycle of operation).

Also, the invalid hit signals are combined within a pair of NAND gates 20-885 and 20-886, as shown. That is, the invalid hit signals for levels 0 and 1 are combined within NAND gate 20-885 while the invalid hit signals for levels 2 and 3 are combined within NAND gate 20-886. When NAND gate 20-885 forces signal DIRPE0010 to a binary ONE, this signals the detection of an invalid hit within levels 0 and 1. Similarly, when NAND gate 20-886 forces signal DIRPE1010 to a binary ONE, this signals the detection of an invalid hit within levels 2 and 3.

The directory hit signals DIRPE0010 and DIRPE1010 are combined with parity error valid signal PARERR110 within a further pair of NAND gates 20-889 and 20-890. When NAND gate 20-889 forces signal DIRPE0000 to a binary ZERO state, this signals that a valid error was detected as having occurred within directory level 0 or 1. Similarly, when NAND gate 20-890 forces signal DIRPE1000 to a binary ZERO state, this signals that a valid error was detected as having occurred within level 2 or 3.

The signals DIRPE0000 and DIRPE1000 respectively control the switching of a pair of D-type flip-flops 20-892 and 20-894. When either signal is switched to a binary ZERO, it causes a corresponding one of the flip-flops 20-892 and 20-894 to switch to a binary ONE state. The output signals DBANK0000 and DBANK1000 from the flip-flop are used to control the counting sequence of the round robin circuits as well as the operation of other cache sections. For example, these signals are combined with the most significant bit signal ROUND0010 from round robin Section 20-80 within the series connected pair of NAND gates 20-895 and 20-896. The output signal ROUND0110 generated by the output gate 20-895 controls or establishes the state of the most significant bit signal ROUND0110 initially generated by the round robin counter circuits of Section 20-80.

More specifically, when both signals DBANK0000 and DBANK1000 are binary ONES, the state of signal ROUND0110 changes as a function of signal ROUND0010. Therefore, the round robin counting sequence proceeds normally.

However, when signal DIRPE0000 switches to a binary ZERO, signal DBANK0000 switches to a binary ZERO. This causes NAND gate 20-895 to force signal ROUND0110 to a binary ONE state. The most significant bit ROUND0110 signal remains a binary ONE as long as signal DBANK0000 is a binary ZERO. Accordingly, the round robin counting sequence is altered so as to only specify levels 2 and 3.

Similarly, when signal DIRPE1000 switches to a binary ZERO, signal DBANK1000 switches to a binary ZERO. This causes NAND gate to force signal ROUND0200 to a binary ONE. The result is that NAND gate 20-895 forces most significant bit signal ROUND0110 to a binary ZERO. This alters the round robin counting sequence so that only levels 0 and 1 are specified. Additionally, signals DBANK0000 and DBANK1000 are applied as inputs to pairs of the comparator circuits of Section 20-42. Thus, the pairs of comparator circuits are inhibited from generating hit signals as a function of the states of signals DBANK0000 and DBANK1000.

Additional gates 20-897 through 20-900 are used to report to the CPU 10 when the cache is operating in a degraded mode signalled as a memory yellow or correctable error condition and when the cache is being placed off-line, signalled as a memory red or uncorrectable error condition. More specifically, AND gate 20-899 combines valid parity error signal PARERR110 with a cache done control from CPU 10 signal CYCADN0C0 to produce memory yellow error signal CADYL0010 which is applied to CPU 10. When both flip-flops are binary ZEROS then NOR gate 20-897 forces signal DIRRED010 to a binary ONE state which is fowarded to CPU 10 via OR gate 20-898 for signalling the occurrence of an uncorrectable condition. Additionally, a further D-type flip-flop 20-891 is used to store the occurrence of a first valid parity error. The output signal PARERR010 from NAND gate 20-887 is inverted by gate 20-903 to produce signal PARERR000 which is combined with cache hit signal CACHIT110 generated by NAND gate 20-902. The resulting signal CACHIT200 is forwarded to Section 20-10 and is used to generate a main memory request as in the case of a normal cache miss condition.

DESCRIPTION OF OPERATION

With reference to FIGS. 1 through 3c, the operation of the preferred embodiment of the present invention will now be described with reference to the flow diagram of FIG. 4 and timing diagram of FIG. 5.

The cache unit of the preferred embodiment of the present invention provides for graceful degradation by causing mode transitions proceeding from a normal mode of operation wherein all four cache levels are operative or active to a degraded mode of operation wherein two levels are operational or active and then to a bypass mode of operation wherein no levels are operational or active. The flow diagram of FIG. 4 illustrates how the occurrences of these mode transitions take place.

It is assumed that the cache unit 20 has been initialized and is operating normally. By way of example, successful read requests are issued by CPU requesting data which has been stored in cache and whose access produces a directory parity error. The operation in response to these requests will now be discussed. When CPU 10 issues a memory read request to the cache unit 20 of FIG. 1, the 20 bit main memory address is applied to the address lines of interface 18 together with the appropriate bus control signals. This starts the timing sequence of FIG. 5 wherein the bus address signals BAR030010 through BAR220010 are received from the address lines of interface 18.

From FIG. 2, it is seen that the 10-bit column address corresponding to signals ADDR08200 through ADDR17200 are applied to the various portions of the directory and cache sections 20-8 and 20-4. Also, at that time, the 10-bit row address corresponding to signals ADDR0010 through ADDR0710, signals ADDR0A10 and ADDR0B10 being applied to the hit/miss control circuits 20-42.

The column address applied to cache directory 20-84 of FIG. 2 causes the read out of a row address from each of the four directory levels. Since this is a read operation, the driver circuits 20-863 of FIG. 3c are disabled. Accordingly, the row address corresponding to signals HDAT00B10 through HDAT39B10 are applied as inputs to the comparator circuits 20-420 through 20-426.

In parallel with the above, the parity generation circuits 20-861 and 20-862 of FIG. 3c generate parity bit signals DPBIT0010 and DPBIT1010 from the input row adress. Since this is a read operation, the driver circuits 20-864a through 20-864d are inhibited. Accordingly, the sets of parity bit signals read out from the directory levels are applied as inputs to comparator circuits 20-869a through 20-869d.

The comparator circuits 20-420 through 20-426 are operative to compare the four directory row addresses with the memory request row address. Since it is assumed that the data being requested has been stored in cache store 20-40, one of the comparator circuits is operative to force one of the hit signals HIT000010 through HIT003010 to a binary ONE state indicative of the hit condition. Simultaneously, comparator circuits 20-866a through 20-866d are operative to compare the directory address parity bits with the parity bits generated from the memory row address.

Since it is assumed that the read request produces a directory parity error, one of the comparator circuits 20-866a through 20-866d is operative to force one of the hit enable signals to a binary ONE state. When the directory parity error occurs in the subdivision or set of levels from which the requested data is stored (i.e., where the hit occurred), then NAND gate 20-877 is operative to force directory parity error signal PARERR010 to a binary ONE.

As seen from FIG. 5, signal PARERR010 is generated approximately 90 nanoseconds following receipt of the memory request. Since this is a read request, approximately 40 nanoseconds later, signal PARERR010 is clocked into flip-flop 20-888 in response to timing signal CPRCLK010 from the clock circuits of Section 20-10. This results in parity error valid signal PARERR110 being forced to a binary ONE. As seen from FIG. 5, this signal immediately gates the states of hit invalid signals DIRPE0010 and DIRPE1010 into degrade mode flip-flops 20-892 and 20-894.

Figure 4:
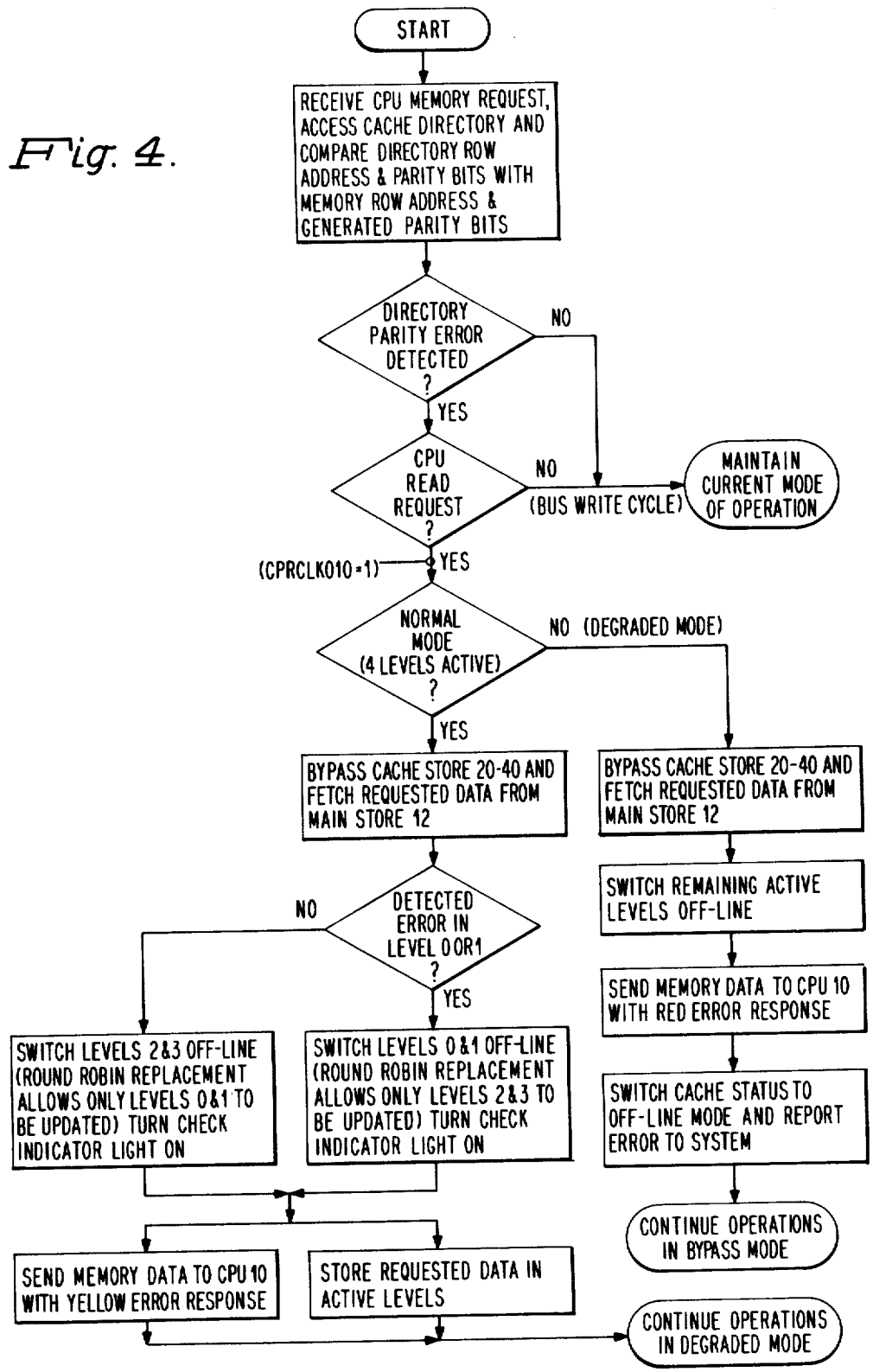
FIG. 4 is a flow diagram used to explain the operation of the present invention.

From the flow chart of FIG. 4, it is seen that the detection of the directory parity error as signalled by signal PARERR110 results in the cache store 20-40 being bypassed and the requested data being fetched from main store 12. More specifically, the generation of a hit condition when signalled by the circuits 20-42 causes NAND gate 20-902 to force cache hit signal CACHIT110 to a binary ONE state. However, signal PARERR000 was forced to a binary ZERO when NAND gate 20-877 was switched to a binary ONE by one of the signals PARERRA00 through PARERR00 being switched to a binary ZERO. This inhibits NAND gate 20-904 from switching signal CACHIT200 to a binary ZERO state. The result is that signal CACHIT200 causes the circuits of Section 20-10 to generate a memory request which is forwarded to main store 12.

As seen from FIG. 4, the circuits 20-880 of FIG. 3c establish in which subdivision of cache the directory parity error occurred. More specifically, the states of degrade mode flip-flops 20-892 and 20-894 define which set or subdivision of levels are to be disabled.

It is assumed that the directory parity error occurred when data stored in level 0 was being accessed. Accordingly, cache operation proceeds to switch levels 0 and 1 off line as shown in FIG. 4. That is, flip-flop 20-892 is switched to a binary ONE state approximately 150 nanoseconds from the receipt of the memory request as shown in FIG. 5.

The result of the above switching forces degraded mode signal DBANK1000 to a binary ZERO. Signal DBANK10000 remains in a binary ONE state. Accordingly, NAND gate 20-895 switches the most significant round robin bit signal ROUND0110 to a binary ONE. As seen from FIG. 5, this occurs approximately 5 nanoseconds following the switching of signal DBANK0000. Signal DBANK0000 causes NAND gate 20-895 to maintain the round robin bit signal ROUND0110 in a binary ONE state. Thus, the round robin counter section 20-80 of FIG. 3a effectively permits memory data to be replaced only within levels 2 and 3 as described herein. Additionally, the binary ZERO signal DBANK0000 disables the level 0 and level 1 comparator circuits 20-420 and 20-422 of FIG. 2. Thus, levels 0 and 1 remain off-line relative to the processing of subsequent memory read requests.

As seen from FIG. 4, valid parity error signal PARERR110 forces yellow error response signal CADYL0010 to a binary ONE. As soon as the requested data from main store 12 is received by the cache unit 20, it is written into the next location of the level specified by the round robin level signal as modified by the circuits 20-880. That is, the replacement circuits of Section 20-10 are operative to force replace signal REPLAC010 to a binary ONE indicative of the replacement operation. This results in write cycle signal CYWRIT010 being forced to a binary ONE by the replacement circuits of Section 20-10.

As seen from FIG. 3a, signal CYWRIT010 causes the level signals ROUND0A10 and ROUND1A10 read out from round robin counter chips 20-800 and 20-802 in response to the memory request column address to be loaded into flip-flops 20-804 and 20-806. As mentioned previously, the most significant bit round robin counter is modified by the state of flip-flop 20-892 of FIG. 3c and is applied to the write control circuits of block 20-82. Since the cache unit 20 is carrying out a replacement operation, select signals SEL001010 and SEL000010 of FIG. 3b are generated as a function of round robin counter signals ROUND1010 and ROUND0110.

In greater detail, the binary ONE state of signal ROUND0110 when inverted, causes NOR gate 20-844 to force select signal SEL000010 to a binary ONE. Select signal SEL001010 is forced to a binary ONE or ZERO as a function of the state of signal ROUND1010. Upon the generation of write pulse signal WRTPLS110, by the replacement circuits of block 20-10, decoder circuit 20-848 forces either write signal WRITE2C00 or WRITE3C00 to a binary ZERO. Similarly, the circuits 28-850 through 20-856 force either write signal WRITE2010 or WRITE3010 to a binary ONE. Accordingly, the data from main store 12 is only written into level 2 or level 3 of the cache directory 20-84 and cache store 20-400.

As seen from FIG. 2, the memory request row address is written into the cache directory levels in response to signal WRITE2C00 or WRITE3C00. In the case of cache store 20-400, the signal WRITE2010 or WRITE3010 causes the select logic circuits 20-430 to force the appropriate one of the chip select signals CHIPS2000 or CHIPS3000 to a binary ZERO for enabling the level 2 or level 3 RAM chips. The data received from main store 12 corresponding to signals DATA00A10 through DATA19A10 is written into the location specified by column address in response to write signal WRITE2C00 or WRITE3C00.

As seen from FIG. 4, as the requested data is being written into cache store 20-400, it is forwarded to CPU via interface 18 along with yellow error response signal CADYL0010. Thereafter, the cache unit 20 continues to process memory requests in degraded mode. Thus, the CPU 10 is able to operate reasonably efficiently notwithstanding the detected cache error or failure.

Obviously, operation could continue in degraded mode until it becomes convenient to correct the fault condition. Since the cache unit 20 automatically carries out the operations of FIG. 4 without employing valuable processing time involving time consuming reporting and/or diagnostic procedures, system operation is enhanced and reliability is increased. Moreover, these operations are carried out with a minimum of additional logic circuits thereby also adding to system reliability.

As seen from FIG. 4, cache unit 20 continues to operate in the degraded mode until a further directory parity error is detected within the active or remaining cache levels which correspond to levels 2 and 3 in this example.

It will be assumed that the next memory read request which produces the error specifies accessing data stored within levels 2 or 3. In the manner described above, the circuits of Section 20-86 of FIG. 3c generate signals which result in hit invalid signal DIRPE1010 being forced to a binary ONE. Since this is a read request, flip-flop 20-888 is again switched to a binary ONE. This time parity error valid signal PARERR110 causes NAND gate 20-890 to force signal DIRPE100 to a binary ZERO which switches degrade mode flip-flop 20-894 to a binary ONE.

As seen from FIG. 3c, signal DBANK1000 is switched to a binary ZERO which causes NOR gate 20-897 to force signal DIRRED010 to a binary ONE. This forces red error response signal CADRED010 to a binary ONE.

As seen from FIG. 4, the binary ZERO state of signal DBANK1000 causes active levels 2 and 3 to be switched off-line by disabling comparator circuits 20-426 and 20-428 of FIG. 2. The cache unit 20 operates to fetch data from main store 12 in the manner previously described. Upon receipt, the data is forwarded to CPU 10 via interface 18 along with red error response signal CADRED010. As seen from FIG. 4, CPU 10 can then take the necessary actions to generate status information indicating that cache unit 20 has been placed in a bypass or off-line mode of operation.

It will be appreciated that if the directory parity error first occurred when data stored within levels 2 and 3 was being accessed then levels 2 and 3 would be placed off-line as indicated in FIG. 4. More specifically, flip-flop 20-894 of FIG. 3c is switched to a binary ONE while flip-flop 20-892 remains in a binary ZERO state. Accordingly, this causes NAND gate 20-895 to force the most significant round robin counter bit signal ROUND0110 to a binary ZERO state. Accordingly, during replacement operations, data is permitted to be written only into levels 0 and 1 of cache directory 20-84 and cache store 20-400. That is, the circuits of Section 20-82 are conditioned by the state of signal ROUND0110 to force only write signals WRITE0C00 and WRITE1C00 to binary ZEROS and signals WRITE0010 and WRITE1010 to binary ONES.

From the foregoing, it is seen how the apparatus of the present invention is able to provide a more reliable and performance effective cache system. Since this is achieved with a minimal increase in apparatus, a high degree of reliability is maintained.

It will be appreciated by those skilled in the art that many changes may be made to the preferred embodiments of the present invention. For example, the apparatus of the present invention may be utilized with different cache organizations (e.g. storage locations, sections, etc.) and different types of error detection apparatus. Also, the invention may employ other types of replacement apparatus such as for example, least recently used replacement schemes. While the apparatus of the preferred embodiment of the present invention operates to degrade the cache storage capacity to one-half of the total capacity in response to directory errors, those skilled in the art will appreciate that the cache storage capacity could have been degraded to one-fourth or other fraction of the total storage capacity.

While in accordance with the provisions and statutes there has been illustrated and described the best form of the invention, certain changes may be made without departing from the spirit of the invention as set forth in the appended claims and that in some cases, certain features of the invention may be used to advantage without a corresponding use of other features.

What is claimed is:

1. A Cache unit for use in a minicomputer system to provide high speed access to main memory data in response to requests, each request containing first and second address portions of a memory address generated by said system, said cache unit comprising:
 a cache store organized into a number of levels of at least one group of storage locations, each group of locations within said levels being defined by a different one of said second address portions;

a directory store organized into the same number of levels of said group of storage locations as in said cache store, each location of said directory store for storing a row address designating which one of said levels of said cache store contains data associated therewith and each different group of locations within said directory store levels being defined by a different one of said second address portions;

error detection means coupled to said directory store, said detection means being operative to generate directory error signals for indicating errors associated with said first address portion being accessed from said directory store; and mode control means being coupled to said error detection means and operatively coupled to said directory store and said cache store, said mode control means being operative in response to a first one of said directory error signals detected during the accessing of data stored in one of said cache store levels to switch said cache unit to a degraded mode of operation, said mode control means when said cache unit is in said degraded mode conditioning said directory store and cache store so as to limit operation only to those directory and cache store levels which were detected as not having any errors.

2. The cache unit of claim 1 wherein said unit further comprises:

addressable replacement circuit means coupled to receive said second address portion of each of said requests, said circuit means having a number of multibit locations, one for each of said different second address portions and each of said multibit locations storing coded information designating a next one of said levels into which replacement data is to be written for said each different second address portion; and said mode control means when said cache unit is in said degraded mode modifying said coded information received from said addressable replacement circuit means resulting in said conditioning of said directory and cache stores so as to limit said replacement data to those directory and store levels detected as not having any errors.

3. The cache unit of claim 2 wherein each of said locations within said levels of said directory store includes a number of parity check bits generated from a first address portion stored therewith and said error detecting means including:

parity generation circuit means coupled to receive said first address portion of each of said requests, said parity generation circuit means being operative to generate said number of parity check bits for said request first address portion; and comparison gating means coupled to said directory store, to said parity generation circuit means and to said mode control means, said comparison gating means being operative in the absence of any comparison between said numbers of parity check bits to generate said directory error signals for indicating that a directory parity error associated with said first address portion of said such request is to be written into said directory store.

4. The cache unit of claim 2 wherein said unit further includes:

comparison means coupled to receive each first address portion of each of said requests and to said directory store, said comparison means for comparing said first address portions received from said directory store levels specified by said second address portion of each request with said first address portion of said each request and said comparison means being operative to generate hit signals for indicating whether or not the data being accessed by said each request is stored in one of said cache store levels of said one group of locations.

5. The cache unit of claim 4 wherein said mode control means includes:

logic circuit means coupled to said comparison means and to said error detection means, said logic circuit means combining said error signals with said hit signals to generate invalid hit signals for identifyin when data being accessed from said one of said cache levels resulted in the generation of said first one of said directory error signals; and bistable means coupled to said logic circuit means and to said replacement circuit means, said bistable means being conditioned by said first one of said invalid hit signals to switch to a predetermined state for placing said cache unit in said degraded mode of operation, said bistable means when in said predetermined state modifying said coded information specified by each second address portion and received from said addressable replacement circuit means to replace information only in those cache store levels which were signalled by said first one of invalid hit signals as having no errors.

6. The cache unit of claim 5 wherein said bistable means couples to said comparison means, said bistable means when in said predetermined state inhibiting said comparison means from generating further hit signals indicating that data specified by each request is stored in the cache level which produced said first one of said invalid hit signals.

7. The cache unit of claim 5 wherein said bistable means is conditioned by a second one of said invalid hit signals to switch to another predetermined state, said bistable means when in said another predetermined state inhibiting said comparison means from generating any further hit signals placing said cache unit in an off-line mode of operation.

8. The cache unit of claim 5 wherein said number of levels of said cache store and said cache directory store include a predetermined number of groups of levels and said coded information includes a plurality of bits corresponding to said predetermined number, said bistable means of said mode control means including:

a plurality of bistable elements corresponding in number to said predetermined number of groups of levels, each of said plurality of bistable elements being coupled to said logic circuit means for receiving said predetermined number of said invalid hit signals, said first one of said invalid hit signals switching a corresponding one of said plurality of bistable elements to said predetermined state, said one of said bistable elements when in said predetermined state conditioning said comparison means and modifying the state of a first predetermined one of said predetermined number of coded information bits read from said addressable replacement circuit means for inhibiting the selection of the associated group of levels within said cache store for access in response to subsequent requests.

9. The cache unit of claim 8 wherein said logic circuit means includes:

a plurality of input gating means corresponding in number to said number of levels, each of said input gating means being coupled to said directory store and to said comparison means for receiving the hit signals and directory error signals corresponding to a different one of said levels, said each input gating means being operative to generate an output hit error signal for indicating of a directory error within said different one of said levels;

a plurality of output gating means corresponding in number to said number of groups of levels, each of said output gating means being coupled to receive said output signal from each of the input gating means of one of said groups of levels and to being coupled to a predetermined one of said plurality of bistable elements, each of said output gating means being operative in response to a first one of said output signals from said input gating means of said one of said groups of levels to switch said predetermined one of said plurality of bistable elements to said predetermined state; and, output logic gating means coupled to said replacement circuit means and to each of said plurality of bistable elements, said output logic gating means combining signals from said plurality of bistable elements representative of said predetermined state and a second predetermined one of said plurality of bits so as to modify said state of said first predetermined one of said bits in accordance with states of said bistable elements.

10. The cache unit of claim 9 wherein said first predetermined one of said plurality of bits corresponds to the most significant bit and wherein said second predetermined one of said plurality of bits corresponds to the least significant bit.

11. The cache unit of claim 10 wherein said number of levels include levels 0, 1, 2 and 3 and said number of groups of levels is at least two, a first one of said output gating means combining the output hit error signals from a first one of said groups of directory levels including levels 0 and 1 and a second one of said output gating means combining the output hit error signals from a second one of said groups of levels including levels 2 and 3, said first one of said output gating means being operative to switch a first one of said plurality of bistable elements to said predetermined state in response to receiving a first hit error signal from directory level 0 or level 1 and said second one of said output gating means being operative to switch a second one of said plurality of bistable elements to said predetermined state in response to said first hit error signal from directory level 2 or 3.

12. The cache unit of claim 11 wherein said output logic gating means includes:
a first gate circuit coupled to said first one of said plurality of bistable elements; and,
a second gate circuit coupled to said second one of said plurality of bistable elements, to said replacement circuit means for receiving said least significant bit and to said first gate circuit, said first one of said plurality of bistable elements when in said predetermined state conditioning said first gate circuit to modify the state of said most significant bit to generate a level sequence 0, 1, 0, 1, etc. and said second one of said plurality of bistable elements when in said predetermined state conditioning said second gate circuit to modify said state of said most significant bit to generate a level sequence 2, 3, 2, 3, etc.

13. The cache unit of claim 9 wherein said mode control means further includes:
bistable means coupled to each of said plurality of input gating means for receiving each of said output hit error signals and to said plurality of output gating means, said bistable means being connected to receive a signal indicating when each of said requests specifies a read operation, said bistable means being conditioned by said each output hit signal to switch to a predetermined state indicating that said output hit error is valid, said bistable means when in said predetermined state enabling said plurality of output gating means for switching the states of said plurality of bistable elements in accordance with said output hit error signals.

14. The cache unit of claim 13 wherein said mode control means further includes first output gating means coupled to said bistable means, said first output gating means being conditioned by said bistable means when in said predetermined state to generate a first response signal indicating that said cache unit has been switched to said degraded mode of operation.

15. The cache unit of claim 12 wherein said mode control means further includes second output gating means coupled to said first and second ones of said plurality of bistable elements, said second output gating means being operative when said first and second bistable elements are in said predetermined state to generate a second response signal indicating that said cache unit has been switched to an off-line mode of operation.

16. A minicomputer system comprising:
a central processing unit for processing instructions and generating memory requests, each containing row and column addresses;
a system bus;
a main store coupled to said system bus, said main store being organized into a number of sets of word locations, the sets of word locations being defined by different ones of said column addresses and locations within a set being defined by different ones of said row addresses; and,
a cache unit coupled to said system bus and to said central processing unit for providing high speed access to main store data words in response to said memory requests, said cache unit comprising:
a cache memory section including:
a cache store organized into a number of levels of sets of word locations for storing data words and said number of levels being organized into a predetermined number of subdivisions, each set of word locations within said levels being defined by a different one of said column addresses; and
a directory section including a directory store organized into the same number of levels of sets of word locations and subdivisions as in said cache store, each word location of said directory store for storing a row address designating in which one of said levels of a set of word locations of said cache store a data word associated therewith is stored and each different set of word locations within said levels being defined by a different one of said column addresses;
said cache section further including comparison means coupled to receive said row address of each of said requests and being coupled to said directory store, said comparison means for comparing each row address received from one of said sets of locations within said directory store levels specified by the column address of said each request with the row address of said each request and said comparison means being operative to generate hit signals for indicating whether or not a word being accessed by said reequest is stored in one of said cache store levels of said one set; and, said directory section further including:

addressable replacement circuit means coupled to receive the column address of each of said memory requests, said circuit means having a number of multibit locations, one for each of said different column addresses and each of said multibit locations storing a plurality of coded information bits to designate a next one of said levels into which replacement information is to be written for said each different column address;

error detection means coupled to said directory store, said detection means being operative to generate directory error signals for indicating errors in directory row addresses being accessed from said directory store; and mode control means being coupled to said error detection means, to said comparison means and to said replacement circuit means, said mode control means being operative in response to a first one of said directory error signals detected in accessing a word stored in one of said cache store levels to switch said cache unit to a degraded mode of operation, said mode control means when in said cache unit is placed in said degraded mode conditioning said comparison means and altering said plurality of coded information bits read from said addressable replacement circuit means so as to limit operation only to the cache store levels of the directory subdivisions which are detected as not having any errors.

17. The system of claim 16 wherein each of said word locations within said levels of said directory store includes a number of parity check bits generated from a row address stored therewith and said error detection means including:

parity generation circuit means coupled to receive said row address of each of said requests, said parity generation circuit means being operative to generate said number of parity check bits for said request row address; and comparison gating means coupled to said directory store, to said parity generation circuit means and to said mode control means, said comparison gating means being operative to generate said directory error signals in the absence of any comparison between said numbers of parity check bits for indicating a directory parity error in said row address received from said directory store.

18. The system of claim 16 wherein said mode control means includes:

logic circuit means coupled to said comparison means and to said error detection means, said logic circuit means combining said error signals with said hit signals to generate invalid hit signals for identifying when said word being accessed from said one of said cache levels resulted in the generation of said first one of said directory error signals; and a plurality of bistable elements corresponding in number to said number of subdivisions, said plurality of elements being coupled to said logic circuit means to said comparison means and to said replacement circuit means, said first one of said invalid hit signals conditioning one of said bistable elements associated with one of said subdivisions of said directory store in which said first one of said directory error signals was detected to switch to a predetermined state placing said cache unit in said degraded mode of operation, said one bistable element when in said predetermined state conditioning said comparison means and modifying the state of a first predetermined one of said coded information bits from said addressable replacement circuit means to inhibit information from being read from and written into the cache store levels of said one subdivision which were detected to result in providing incorrect data.

19. The system of claim 18 wherein said logic circuit means is operative to generate a second invalid hit signal in response to a second one of said directory error signals produced from accessing another one of said number of subdivisions of said directory store, said second invalid hit signal conditioning another one of said bistable elements associated with said another subdivision to switch to said predetermined state for placing said cache unit in a further degraded mode of operation, said another one of bistable elements when in said predetermined state further conditioning said comparison means and further modifying said bits from said addressable replacement circuit means to inhibit information from being read and written into the cache store levels of said one and said another one of said number of subdivisions which were detected to result in providing incorrect data.

20. The system of claim 19 wherein the number of subdivisions is two and said further degraded mode of operation corresponds to an off-line mode of operation.

21. The system of claim 18 wherein said logic circuit means includes:

a plurality of input gating means corresponding in number to said number of levels, each of said input gating means being coupled to said directory store and to said comparison means for receiving the hit signals and directory error signals corresponding to a different one of said levels, said each input gating means being operative to generate an output hit error signal for indicating of a directory error within said different one of said levels;

a plurality of output gating means corresponding in number to said number of subdivisions, each of said output gating means being coupled to receive said output signal from each of the input gating means of one of said subdivisions and to being coupled to a predetermined one of said plurality of bistable elements, each of said output gating means being operative in response to a first one of said output signals from said input gating means of said one of said subdivisions to switch said predetermined one of said plurality of bistable elements to said predetermined state; and output logic gating means coupled to said replacement circuit means and to each of said plurality of bistable elements, said output logic gating means combining signals from each of said plurality of bistable elements representative of said predetermined state and a second predetermined one of said plurality of bits so as to modify said state of said first predetermined one of said bits in accordance with states of said bistable elements.

22. The system of claim 21 wherein said first predetermined one of said plurality of bits corresponds to the most significant bit and wherein said second predetermined one of said plurality of bits corresponds to the least significant bit.

23. The cache unit of claim 21 wherein said number of levels include at least levels 0, 1, 2 and 3 and said number of subdivisions of levels is at least two, a first one of said output gating means combining the output hit error signals from a first one of said subdivisions of directory levels including levels 0 and 1 and a second one of said output gating means combining the output hit error signals from a second one of said subdivisions of levels including levels 2 and 3, said first one of said output gating means being operative to switch a first one of said plurality of bistable elements to said predetermined state in response to a first hit error signal from directory level 0 or level 1 and said second one of said output gating means being operative to switch a second one of said plurality of bistable elements to said predetermined state in response to said first hit error signal from directory level 2 or 3.

24. The cache unit of claim 23 wherein said output logic gating means includes:
 a first gate circuit coupled to said first one of said plurality of bistable elements; and,
 a second gate circuit coupled to said second one of said plurality of bistable elements, to said replacement circuit means for receiving said least significant bit and to said first gate circuit, said first one of said plurality of bistable elements when in said predetermined state conditioning said first gate circuit to modify the state of said most significant bit to generate a level sequence 0, 1, 0, 1, etc. and said second one of said plurality of bistable elements when in said predetermined state conditioning said second gate circuit to modify said state of said most significant bit to generate a level sequence 2, 3, 2, 3, etc.

25. The system of claim 18 wherein said directory section further includes:
 write control circuit means coupled to said comparison means for receiving said hit signals and to said replacement circuit means and said mode control means for receiving said coded information bits as altered by said mode control means, said write control circuit means being operative during replacement and write cycles of operation to generate a plurality of write signals in accordance with the states of said hit signals and altered coded information bits for enabling information to be written into the cache store levels of the directory subdivisions which were detected as having no errors.

26. The system of claim 25 wherein said cache section further includes:
 selection control means coupled to said comparison means and to said write control means, said selection control means being coupled to said cache store levels and operative during read and write cycles of operation to generate a plurality of selection signals in accordance with hit signals received from said comparison means and said plurality of write signals, said selection signals being applied to said cache store levels for enabling information to be read from and written into said cache store levels of the directory subdivisions which were detected as having no errors.

27. A cache unit being coupled to a bus for receiving memory requests, each request including row and column addresses from a minicomputer processing unit for enabling high speed access to main memory data words fetched by said cache unit, said cache unit comprising:
 a cache store being organized into n number of levels of sets of word locations, each set of word locations within said levels for storing data words and being defined by a different one of said column addresses;
 a directory store organized into said n number of levels of sets of word locations, each word location for storing a row address designating which one of said levels of said cache store contains a corresponding one of said words and each different set of word locations within said levels being defined by a different one of said column addresses;
 comparison means coupled to receive each of said row addresses of said requests and being coupled to said directory store, said comparison means for comparing the row addresses received from one of said sets of locations within said directory store levels specified by the column address of each request with the row address of said request and said comparison means being operative to generate a plurality of hit signals for indicating whether or not a word being accessed by said request is stored in one of said cache store levels of said one set;
 addressable random access memory replacement circuit means having a number of multibit locations, each location read out in response to said request column address storing n level assignment bits for each nth power of 2 number of levels for each of said column addresses designating a next one of said levels into which replacement information is to be written;
 error detection means coupled to said directory store levels, said detection means being operative to generate directory error signals for indicating errors in directory store row addresses being accessed from said directory store; and
 mode control means being coupled to said error detection means, to said comparison means and to said replacement circuit means, said mode control means including logic circuit means for combining said directory error signals with said hit signals to produce invalid hit detection signals identifying that the memory request would result in incorrect data being provided to said processing unit by said cache unit, said logic circuit means for combining being operative in response to a first one of said invalid hit detection signals detected in accessing a word stored in one of said cache store levels to switch said cache unit to a degraded mode of operation, said mode control means when in said cache unit is placed in said degraded mode of operation conditioning said comparison means and altering said n level asignment bits received from said addressable replacement circuit means so as to limit operation to n−k number of cache levels wherein k is a whole integer corresponding to the number of levels by which the storage capacity of said cache is decreased.

28. The cache unit of claim 27 wherein k has a value which is equal to or less than n/2.

29. The cache unit of claim 27 wherein each of said locations within said levels of said directory store includes a number of parity check bits generated from each of said row addresses stored therewith and said error detection means including:
   parity generation circuit means coupled to receive said row addresses of said requests, said parity generation circuit means being operative to generate said number of parity check bits; and
   comparison gating means coupled to said directory store, and parity generation circuit means and to said mode control means, said comparison gating means being operative in the absence of any comparison between said number of parity check bits to generate said directory error signals for indicating a directory parity error associated with said row address of said each request to be written into said directory store.

30. The cache unit of claim 27 wherein said n levels of said cache store and directory store are organized into k number of subdivisions and said mode control means further includes:
   a plurality of bistable elements corresponding in number to said number of subdivisions, said plurality of elements being coupled to said logic circuit means, to said comparison means and to said replacement circuit means, said first one of said invalid hit signals conditioning one of said bistable elements associated with the directory store subdivision whose access would result in said incorrect data to switch to a predetermined state for placing said cache unit in said degraded mode of operation, said one of said bistable elements when in said predetermined state inhibiting said comparison means from generating further hit signals from accessing said directory store subdivision and modifying a first predetermined bit of said m level assignment bits read from said addressable replacement circuit means in response to said column addresses to inhibit the replacement of data in the levels of the corresponding cache subdivision thereby reducing the cache storage capacity by k number of levels.

31. The system of claim 30 wherein said logic circuit means is operative to generate a second invalid hit signal in response to a second one of said directory error signals produced from accessing another one of said number of subdivisions of said directory store, said second invalid hit signal conditioning another one of said bistable elements associated with said another subdivision to switch to said predetermined state, said another one of bistable elements when in said predetermined state further conditioning said comparison means and further modifying said bits from said addressable replacement circuit means to inhibit information from being read and written into the cache store levels of said one and said another one of said number of subdivisions so as to limit operation to n−2k number of cache levels.

32. The system of claim 31 wherein n has a value of four and the number of subdivisions is two and said another one of said bistable elements when in said predetermined state places said cache unit in an off-line mode of operation.

33. The system of claim 30 wherein said logic circuit means includes:
   n number of input gating means, each of said input gating means being coupled to said directory store and to said comparison means for receiving the hit signals and directory error signals corresponding to a different one of said levels, said each input gating means being operative to generate an output hit error signal for indicating of a directory error within said different one of said levels;
   a plurality of output gating means corresponding in number to said number of subdivisions, each of said output gating means being coupled to receive said output signal from each of the input gating means of one of said subdivisions and to being coupled to a predetermined one of said plurality of bistable elements, each of said output gating means being operative in response to a first one of said output signals from said input gating means of said one of said subdivisions to switch said predetermined one of said plurality of bistable elements to said predetermined state; and
   output logic gating means coupled to said replacement circuit means and to each of said plurality of bistable elements, said output logic gating means combining signals from each of said plurality of bistable elements representative of said predetermined state and a second predetermined one of said plurality of bits so as to modify said state of said first predetermined one of said bits in accordance with states of said bistable elements.

34. The system of claim 33 wherein said first predetermined one of said plurality of bits corresponds to the most significant bit and wherein said second predetermined one of said plurality of bits corresponds to the least significant bit.

35. The cache unit of claim 33 wherein said n number of levels include at least levels 0, 1, 2 and 3 and said number of subdivisions of levels is at least two, a first one of said output gating means combining the output hit error signals from a first one of said subdivisions of directory levels including levels 0 and 1 and a second one of said output gating means combining the output hit error signals from a second one of said subdivisions of levels including levels 2 and 3, said first one of said output gating means being operative to switch a first one of said plurality of bistable elements to said predetermined state in response to a first hit error signal from directory level 0 or level 1 and said second one of said output gating means being operative to switch a second one of said plurality of bistable elements to said predetermined state in response to said first hit error signal from directory level 2 or 3.

36. The cache unit of claim 35 wherein said output logic gating means includes:
   a first gating circuit coupled to said first one of said plurality of bistable elements; and,
   a second gate circuit coupled to said second one of said plurality of bistable elements, to said replacement circuit means for receiving said least significant bit and to said first gate circuit, said first one of said plurality of bistable elements when in said predetermined state conditioning said first gate circuit to modify the state of said most significant bit to generate a level sequence 0, 1, 0, 1, etc. and said second one of said plurality of bistable elements when in said predetermined state conditioning said second gate circuit to modify said state of said most significant bit to generate a level sequence 2, 3, 2, 3, etc.

* * * * *